(12) United States Patent
Ueda

(10) Patent No.: US 6,828,585 B2
(45) Date of Patent: Dec. 7, 2004

(54) THIN-FILM TRANSISTOR, METHOD FOR FABRICATING THE SAME, AND LIQUID CRYSTAL DISPLAY DEVICE

(75) Inventor: Tohru Ueda, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 110 days.

(21) Appl. No.: 10/020,440

(22) Filed: Dec. 18, 2001

(65) Prior Publication Data

US 2002/0125535 A1 Sep. 12, 2002

(30) Foreign Application Priority Data

Dec. 19, 2000 (JP) ........................................ 2000-385523

(51) Int. Cl.$^7$ .............................................. H01L 29/04
(52) U.S. Cl. .............................. 257/59; 257/61; 257/72; 257/344; 257/408; 359/59
(58) Field of Search ............................ 359/59; 349/43; 257/72, 344, 408

(56) References Cited

U.S. PATENT DOCUMENTS 5,412,493 A * 5/1995 Kunii et al. ................... 349/43

FOREIGN PATENT DOCUMENTS

| EP | 1 006 589 | 6/2000 |
|---|---|---|
| JP | 6-265940 A | 9/1994 |
| JP | 7-263705 A | 10/1995 |
| JP | 10-135474 | 5/1998 |
| JP | 2000-228527 | 8/2000 |

OTHER PUBLICATIONS

Japanese Office Action dated Oct. 28, 2003 (along with English translation thereof).

* cited by examiner

*Primary Examiner*—David Nelms
*Assistant Examiner*—Mai-Huong Tran
(74) *Attorney, Agent, or Firm*—Nixon & Vanderhye P.C.

(57) ABSTRACT

A thin-film transistor includes: a pair of n-type heavily doped regions that are horizontally spaced apart from each other; p-type channel regions that are located between the n-type heavily doped regions so as to face their associated gate electrodes, respectively; an n-type intermediate region provided between two adjacent ones of the channel regions; and two pairs of lightly doped regions. The lightly doped regions in one of the two pairs have mutually different carrier concentrations and are located between one of the heavily doped regions and one of the channel regions that is closer to the heavily doped region than any other channel region is. The lightly doped regions in the other pair also have mutually different carrier concentrations and are located between the other heavily doped region and another one of the channel regions that is closer to the heavily doped region than any other channel region is.

19 Claims, 12 Drawing Sheets

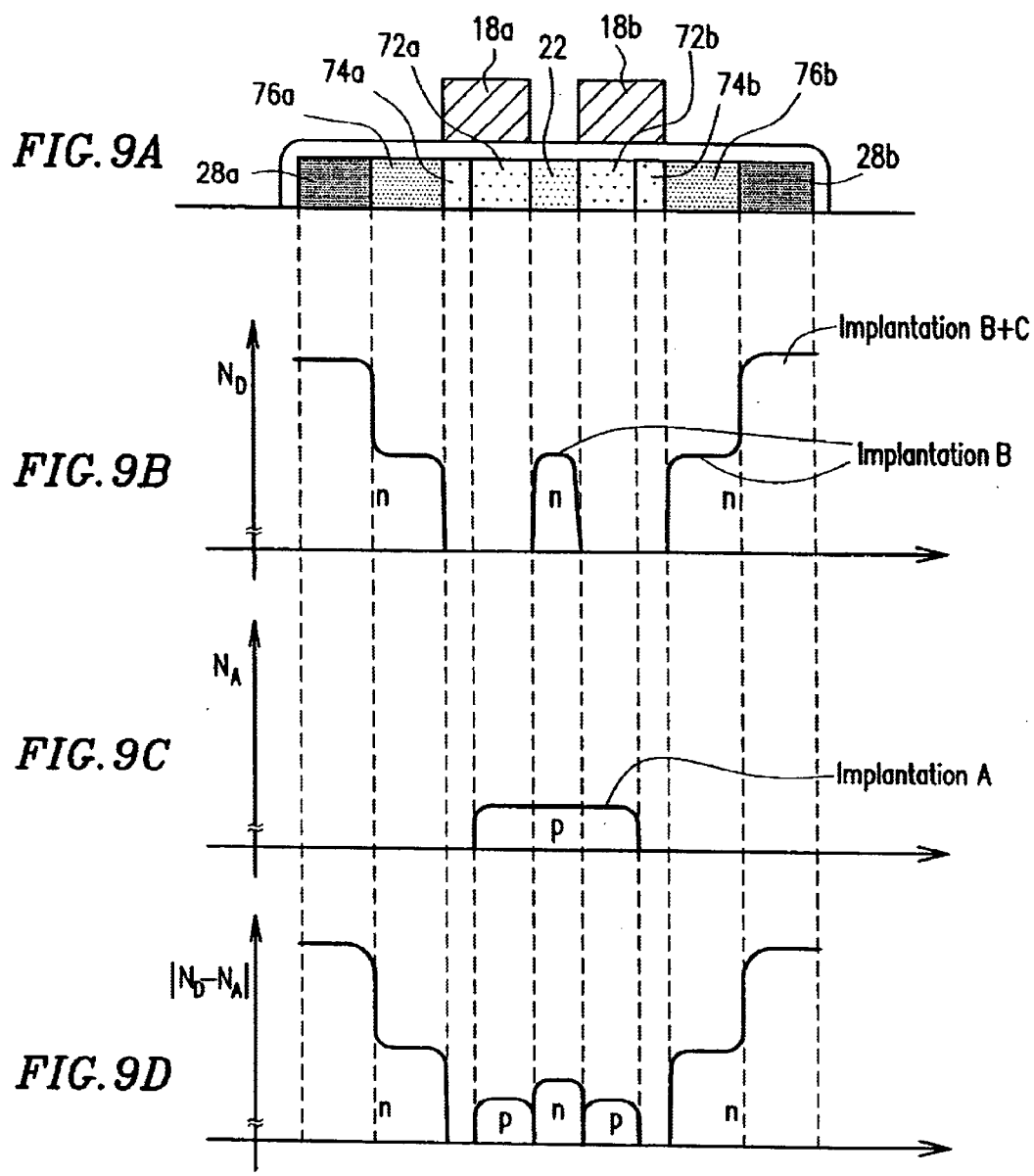

THIN-FILM TRANSISTOR, METHOD FOR FABRICATING THE SAME, AND LIQUID CRYSTAL DISPLAY DEVICE

BACKGROUND OF THE INVENTION

The present invention relates to a thin-film transistor preferably for use in an active-matrix-addressed liquid crystal display device, contact image sensor and other suitable devices and also relates to a method for fabricating such a transistor.

Recently, an active-matrix-addressed liquid crystal display device has been used as a display device for personal computers, TV sets of a reduced thickness, camcorders and so on. In an active-matrix-addressed liquid crystal display device, a thin-film transistor (TFT) is extensively used as a switching element that selectively turns a pixel ON or OFF. A TFT is provided for each of a huge number of pixels so that each of those pixels has its ON/OFF states controlled by its associated TFT.

When a TFT turns ON responsive a scanning signal that has been applied to the gate of the TFT, a predetermined signal voltage is applied to a pixel electrode, which is connected to the drain of the TFT, by way of a data bus line connected to the source of the TFT. In a liquid crystal display device, the orientation state of its liquid crystal layer changes in accordance with the level of a signal voltage applied to a pixel electrode. And by utilizing this change in orientation, an image is displayed thereon.

In an interval after a predetermined signal voltage has been applied to a pixel electrode and before another signal voltage is newly applied to this pixel electrode (i.e., one frame interval), no scanning signal is applied to the gate of a TFT associated with the pixel electrode. That is to say, the TFT is kept OFF to maintain a predetermined display state by keeping the potential level at the pixel electrode constant during this interval. While the TFT is OFF, the amount of current flowing through the TFT (i.e., leakage current or OFF-state current) is preferably as small as possible. This is because if an excessive amount of OFF-state current flows through the TFT, then the liquid crystal layer cannot maintain its desired orientation state and the resultant display quality deteriorates.

Particularly in a TFT including a polysilicon layer as its semiconductor layer, a greater amount of OFF-state current tends to flow through the TFT as compared to a TFT including an amorphous silicon layer as its semiconductor. This is because field-effect mobility is higher in a polysilicon layer than in an amorphous silicon layer. Accordingly, it is even more difficult to maintain the potential level of a pixel electrode associated with such a TFT.

Also, the higher the definition of a display device, the greater the number of pixels the display device should include. If the number of pixels included in a display device is increased, then each of those pixels should be driven in a shorter period of time. In that case, a greater amount of ON-state current should flow through each TFT.

Furthermore, in a small-sized high-definition liquid crystal display for a liquid crystal projector, for example, the size of each pixel has been further reduced. To increase the brightness of an image presented on such a display, the aperture ratio needs to be increased for each pixel region and each TFT needs to be further downsized. On the other hand, to mass-produce an enormous number of display devices at a high yield, measures should be taken against TFT leakage failures resulting from various types of defects.

In summary, a TFT, particularly one for use to drive its associated pixel in a small-sized high-definition liquid crystal display, preferably has:
1) small leakage current;
2) large ON-state current;
3) small size; and
4) no leakage failures.

A TFT having these advantageous features is disclosed in Japanese Laid-Open Publication No. 7-263705, for example. The TFT has a so-called "multi-gate structure" and a so-called "LDD (lightly doped drain) structure" in combination. Hereinafter, the TFT disclosed in this publication will be described with reference to FIG. 11.

In the TFT 90 shown in FIG. 11, a pair of gate electrodes 96a and 96b is formed over a semiconductor thin film 92 with an insulating film 94 interposed therebetween. Channel regions 97a and 97b are defined in parts of the semiconductor thin film 92 that are located under the gate electrodes 96a and 96b, respectively. And the channel regions 97a and 97b are interposed or surrounded by lightly doped regions 98a and 98b and heavily doped regions (i.e., source/drain regions) 99a and 99b. Also, another lightly doped region (intermediate region) 95 is defined between the channel regions 97a and 97b.

By interposing the lightly-doped region (LDD region) 98b between the drain region (i.e., the heavily doped region) 99b and channel region 97b, the intensity of an electric field is weakened at the end of the drain region 99b, thus reducing the leakage current. Also, this TFT has a multi-gate structure having an equivalent circuit configuration in which two single-gate TFTs are connected in series together. Thus, even if a leakage failure has been caused in one of the two TFTs, the other TFT still serves as a switching element. In this manner, redundancy is ensured for leakage failures.

In addition, in the TFT 90 disclosed in the publication identified above, the length of the intermediate region 95 is smaller than the total length of the lightly doped regions 98a and 98b, thereby increasing the amount of ON-state current. Furthermore, the TFT 90 includes no heavily doped region between the gate electrodes 96a and 96b. Thus, the space between the gate electrodes 96a and 96b may be narrowed, and therefore the TFT 90 may be downsized.

Hereinafter, it will be described with reference to FIGS. 12A through 12G how to fabricate a TFT substrate (including the TFT 90) for a liquid crystal display device.

First, in the process step shown in FIG. 12A, a semiconductor thin film 92 of polysilicon (poly-Si), for example, is deposited on an active region on an insulating substrate 91. Then, a surface portion of the semiconductor thin film 92 is oxidized, for example, thereby forming an insulating film 94 thereon.

Next, in the process step shown in FIG. 12B, dopant ions (e.g., B$^+$ ions) may be implanted at a predetermined dose (of e.g., about $1\times10^{12}/cm^2$ to about $8\times10^{12}/cm^2$) into the entire semiconductor thin film 92 if necessary. In this process step, the characteristic of a channel region for the TFT is determined and the threshold voltage of the TFT is controlled.

Thereafter, in the process step shown in FIG. 12C, gate electrodes 96a and 96b are formed over the semiconductor thin film 92 that has been covered with the insulating film 94. Specifically, the gate electrodes 96a and 96b may be formed by depositing a low-resistivity poly-Si thin film doped with phosphorus on the insulating film 94 and then by patterning the poly-Si thin film into a desired shape. It should be noted that if necessary, a silicon nitride film or any other suitable undercoat film may be formed on the insulating film 94 as shown in FIG. 12C before the gate electrodes 96a and 96b are formed thereon.

Then, in the process step shown in FIG. 12D, dopant ions (e.g., P+ ions) are implanted at a relatively low dose into selected parts of the semiconductor thin film 92 using the gate electrodes 96a and 96b as a mask. In this manner, lightly doped regions are defined in those parts of the semiconductor thin film 92, which are not covered with the gate electrodes 96a and 96b, so as to be self-aligned with the gate electrodes 96a and 96b.

Subsequently, in the process step shown in FIG. 12E, a resist pattern 93 is defined so as to cover the gate electrodes 96a and 96b entirely and the surface of the insulating film 94 partially. The resist pattern 93 should be formed in such a manner that the right- and left-hand-side edges thereof are spaced apart from the associated side faces of the gate electrodes 96a and 96b by a predetermined distance. Using this resist pattern 93 as a mask, dopant ions (e.g., As+ ions) are implanted at a relatively high dose into the non-masked parts of the lightly doped regions. In this manner, those parts of the lightly doped regions are changed into heavily doped regions, which will be source/drain regions for the TFT.

Thereafter, in the process step shown in FIG. 12F, the TFT formed in this manner is covered with an interlevel dielectric film, the dopants introduced are activated through annealing, and then a contact hole is formed through a part of the interlevel dielectric film that is located over the source region.

Subsequently, in the process step shown in FIG. 12G, a data bus line S made of a conductor is formed so as to make electrical contact with the source region via the contact hole. Next, another insulating film is deposited over the entire surface of the substrate and then another contact hole is formed through a part of the insulating films that is located over the drain region. Then, a transparent electrode (i.e., pixel electrode) P of ITO, for example, is formed inside the contact hole so as to make electrical contact with the drain region. In this manner, a TFT substrate for use in an active-matrix-addressed liquid crystal display device is completed.

As described above, the conventional TFT 90 has the multi-gate structure and can reduce the probability of leakage failures. Also, since the intermediate region is a lightly doped region, the space between the gate electrodes can be narrowed and the TFT can be downsized.

However, the TFT 90 cannot reduce the leakage current and increase the ON-state current at the same time. Specifically, if the dopant concentration of the LDD regions is increased, then the ON-state current of the TFT 90 can be increased but the amount of leakage current flowing therethrough also increases. On the other hand, if the dopant concentration of the LDD regions is decreased, then a decreased amount of leakage current will flow through the TFT 90 but the ON-state current thereof also decreases.

SUMMARY OF THE INVENTION

In order to overcome the problems described above, preferred embodiments of the present invention provide (1) a thin-film transistor through which a decreased amount of leakage current and an increased amount of ON-state current flow, (2) a method for fabricating such a transistor and (3) a liquid crystal display device that includes the thin-film transistor of the present invention and that realizes higher display quality.

A thin-film transistor according to the present invention includes a semiconductor layer and multiple gate electrodes that have been formed over the semiconductor layer. The semiconductor layer includes: first and second heavily doped regions, which have a first conductivity type, are spaced apart from each other and serve as source/drain regions; and a plurality of channel regions, which have a second conductivity type, are located between the first and second heavily doped regions so as to face the gate electrodes, and include first and second channel regions. The first channel region is closer to the first heavily doped region than any other one of the channel regions is, while the second channel region is closer to the second heavily doped region than any other one of the channel regions is. The semiconductor layer further includes: an intermediate region, which has the first conductivity type and is located between two mutually adjacent ones of the channel regions; a first lightly doped region, which has the first conductivity type and is located between the first channel region and the first heavily doped region; a second lightly doped region, which has the first conductivity type and is located between the second channel region and the second heavily doped region; a third lightly doped region, which has the first conductivity type, has a carrier concentration different from that of the first lightly doped region and is located between the first lightly doped region and the first channel region; and a fourth lightly doped region, which has the first conductivity type, has a carrier concentration different from that of the second lightly doped region and is located between the second lightly doped region and the second channel region.

In a preferred embodiment of the present invention, the first and second heavily doped regions have substantially the same carrier concentration; the first and second lightly doped regions also have substantially the same carrier concentration; the third and fourth lightly doped regions and the intermediate region also have substantially the same carrier concentration; the carrier concentration of the first heavily doped region is substantially higher than that of the first lightly doped region; and the carrier concentration of the first lightly doped region is substantially higher than that of the third lightly doped region.

In another preferred embodiment, the channel regions, the intermediate region and the third and fourth lightly doped regions of the semiconductor layer have been doped with a dopant of the second conductivity type at substantially the same dose.

In this particular embodiment, the third and fourth lightly doped regions have been doped not only with the dopant of the second conductivity type but also the same dopant of the first conductivity type as a dopant that has been introduced into the first and second lightly doped regions.

More particularly, a difference between the carrier concentration of the third lightly doped region and that of the first lightly doped region may be caused by the dopant of the second conductivity type that has been introduced into the third lightly doped region.

Alternatively, a difference between the carrier concentration of the fourth lightly doped region and that of the second lightly doped region may be caused by the dopant of the second conductivity type that has been introduced into the fourth lightly doped region.

In still another embodiment, the first and second lightly doped regions may have substantially the same length.

In yet another embodiment, the third and fourth lightly doped regions may have substantially the same length.

In yet another embodiment, the intermediate region may have a length smaller than a total length of the first and third lightly doped regions.

In yet another embodiment, the intermediate region may have a length smaller than a total length of the second and fourth lightly doped regions.

An inventive method for fabricating a thin-film transistor includes the steps of: forming a semiconductor thin film on an insulating substrate; doping a first region of the semiconductor thin film, which includes a part that will serve as a channel region, with a first dopant of a first conductivity type; forming at least one gate electrode on the semiconductor thin film so that the part of the semiconductor thin film that will serve as the channel region is covered with the gate electrode; selectively doping a second region of the semiconductor thin film with a second dopant of a second conductivity type using the gate electrode as a mask, the second region including other parts of the first region, except the part that will serve as the channel region, and other parts of the semiconductor thin film that surround the first region; and doping a third region of the semiconductor thin film with a third dopant of the second conductivity type, thereby defining regions that will serve as source/drain regions, the third region being so defined as to be spaced apart, by a predetermined distance, from an outer edge of parts of the semiconductor thin film where the first and second region overlap with each other.

In a preferred embodiment of the present invention, the second and third regions overlap with each other at least partially.

In another preferred embodiment of the present invention, an implant dose of the second dopant is smaller than an implant dose of the third dopant.

A thin-film transistor according to the present invention includes a semiconductor layer and multiple gate electrodes that have been formed over the semiconductor layer. The semiconductor layer includes: first and second heavily doped regions, which are spaced apart from each other and serve as source/drain regions; and a plurality of channel regions, which are located between the first and second heavily doped regions so as to face the gate electrodes and which include first and second channel regions. The first channel region is closer to the first heavily doped region than any other one of the channel regions is, while the second channel region is closer to the second heavily doped region than any other one of the channel regions is. The semiconductor layer further includes: an intermediate region located between two mutually adjacent ones of the channel regions; a first lightly doped region located between the first channel region and the first heavily doped region; and a second lightly doped region located between the second channel region and the second heavily doped region. The first channel region includes a first intrinsic channel region and the second channel region includes a second intrinsic channel region.

In a preferred embodiment of the present invention, the first and second intrinsic channel regions are substantially covered with associated ones of the gate electrodes.

In another preferred embodiment of the present invention, the first channel region includes a doped channel region between the first intrinsic channel region and the intermediate region, while the second channel region includes a doped channel region between the second intrinsic channel region and the intermediate region.

In this particular embodiment, the respective doped channel regions of the first and second channel regions and the intermediate region have preferably been doped with a dopant of a first conductivity type at a predetermined dose.

In still another embodiment, the first and second lightly doped regions may have substantially the same length.

In yet another embodiment, the first and second intrinsic channel regions may have substantially the same length.

In yet another embodiment, the first and second intrinsic channel regions may be each shorter than any of the intermediate region, the first lightly doped region and the second lightly doped region.

An inventive method for fabricating a thin-film transistor includes the steps of: forming a semiconductor thin film on an insulating substrate; doping a first region of the semiconductor thin film with a first dopant of a first conductivity type; forming at least one gate electrode on the semiconductor thin film so that a part of the first region and a part of the semiconductor thin film that surrounds the first region are covered with the gate electrode; selectively doping a second region of the semiconductor thin film with a second dopant of a second conductivity type using the gate electrode as a mask, the second region including at least a part of the first region and other parts of the semiconductor thin film that surround the first region and that are not covered with the gate electrode; and doping a fourth region of the semiconductor thin film with a third dopant of the second conductivity type, the fourth region being so defined as to be spaced apart from a third region of the semiconductor thin film by a predetermined distance, the third region including at least the part of the first region and the part of the semiconductor thin film that is covered with the gate electrode.

In a preferred embodiment of the present invention, the second and fourth regions overlap with each other at least partially.

An active-matrix-addressed liquid crystal display device according to the present invention includes: a substrate, on which the thin-film transistor according to any of the preferred embodiments of the present invention; a data bus line electrically connected to the first heavily doped region of the thin-film transistor; a gate bus line electrically connected to at least one of the gate electrodes of the thin-film transistor; and a pixel electrode electrically connected to the second heavily doped region of the thin-film transistor have been formed; and a liquid crystal layer, which has an optical state changeable with a potential level at the pixel electrode.

It should be noted that the terms "first conductivity type" and "second conductivity type" are herein used to identify n-type and p-type from each other. In other words, one of n- and p-types will be herein referred to as the "first conductivity type" and the other will be herein referred to as the "second conductivity type". That is to say, the first conductivity type is n- or p-type and the second conductivity type is p- or n-type.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 9A is a cross-sectional view illustrating the TFT of the third embodiment;

FIG. 9B illustrates a concentration profile of an n-type dopant that has been introduced into the TFT shown in FIG. 9A;

FIG. 9C illustrates a concentration profile of a p-type dopant that has been introduced into the TFT shown in FIG. 9A; and FIG. 9D illustrates an overall carrier concentration profile of the TFT shown in FIG. 9A.

DETAILED DESCRIPTION OF PREFERRED EMBODIMENTS

Hereinafter, preferred embodiments of the present invention will be described with reference to the accompanying drawings.

Embodiment 1

Figure 1:
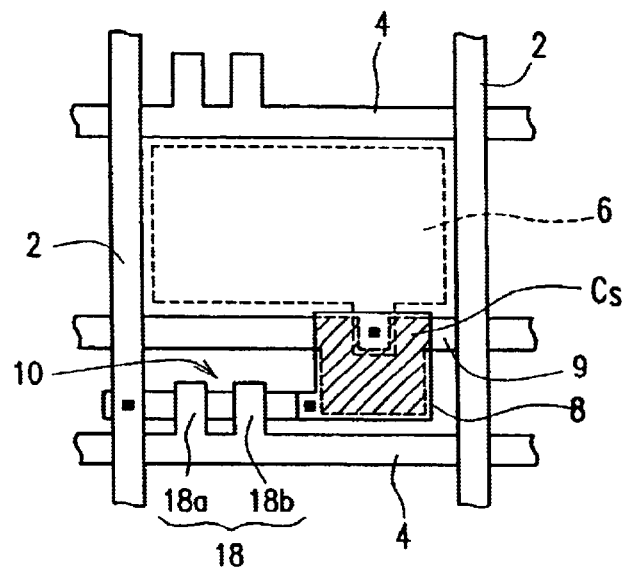
FIG. 1 is a plan view schematically illustrating an active matrix substrate including a TFT according to a first specific preferred embodiment of the present invention.

FIG. 1 illustrates part of a TFT substrate (or active matrix substrate) for use in an active-matrix-addressed liquid crystal display device. The part illustrated in FIG. 1 includes a thin-film transistor 10 according to a first specific preferred embodiment of the present invention and corresponds to one pixel region of the TFT substrate. As shown in FIG. 1, the pixel region is surrounded by data bus lines 2, each of which supplies a data signal to its associated pixel electrode 6, and by gate bus lines 4, each of which supplies a scanning signal to its associated gate electrodes 18.

The TFT 10 of a multi-gate type has been formed as a switching element for driving the pixel near the intersection between the data bus line 2 and gate bus line 4. The source of the TFT 10 is electrically connected to its associated data bus line 2. A pair of gate electrodes 18a and 18b of the TFT 10 extends from its associated gate bus line 4. The drain of the TFT 10 is electrically connected to its associated pixel electrode 6.

In the preferred embodiment illustrated in FIG. 1, a storage capacitance $C_S$ is formed between a drain electrode 8 connected to the drain of the TFT 10 and a storage capacitance line 9 that has an electrode section facing the drain electrode 8 as indicated by the hatching in FIG. 1. However, the storage capacitance may be formed in any other form. Also, in the embodiment illustrated in FIG. 1, the drain of the TFT 10 is electrically connected to the pixel electrode 6 by way of the drain electrode 8. Alternatively, the drain of the TFT 10 may be directly connected to the pixel electrode 6.

Figure 2:
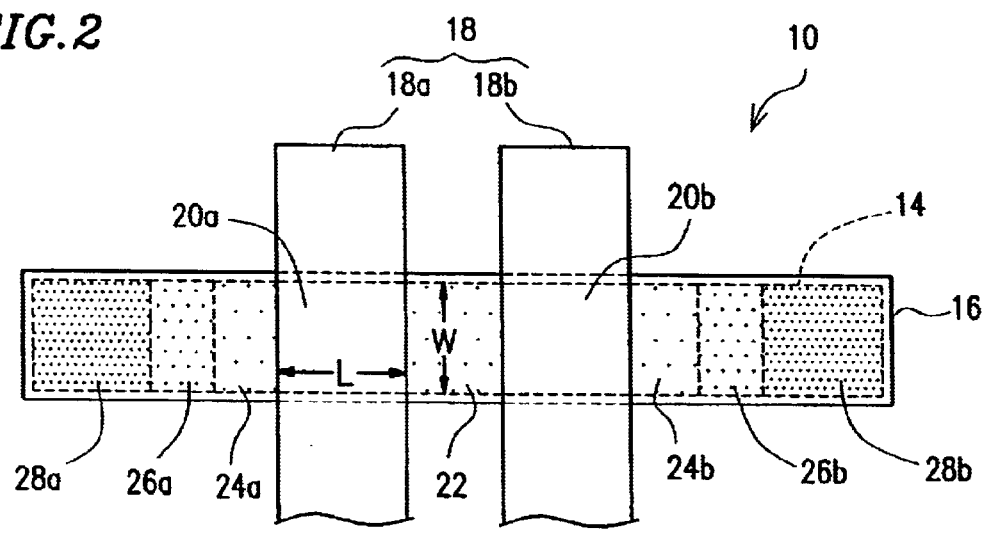
FIG. 2 is a plan view schematically illustrating the TFT of the first embodiment.

Hereinafter, an exemplary configuration for the TFT 10 of this first specific embodiment will be described with reference to FIGS. 2 and 3. In the following description, the TFT 10 of this illustrative embodiment is of n-channel type. However, the present invention is not limited to this specific embodiment but may naturally be applicable to a p-channel TFT.

Figure 3:
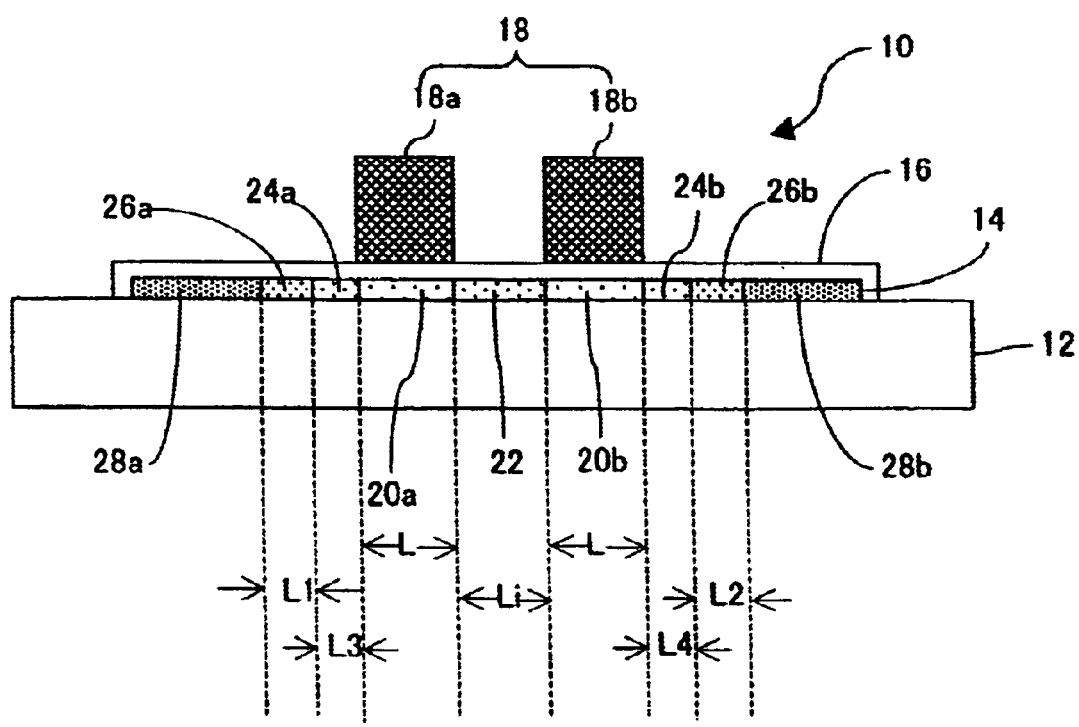
FIG. 3 is a cross-sectional view schematically illustrating the TFT of the first embodiment.

As shown in FIG. 3, the TFT 10 has been formed on an insulating substrate 12 of quartz, for example, so as to include a semiconductor layer 14 of polysilicon, for example, and a pair of gate electrodes 18a and 18b that has been formed over the semiconductor layer 14 with a gate insulating film 16 interposed between them. As shown in FIG. 2, the pair of gate electrodes 18a and 18b is located around the center of the semiconductor layer 14 so as to be horizontally spaced apart from each other in the direction in which the semiconductor layer 14 extends and to cross the semiconductor layer 14.

In the semiconductor layer 14, channel regions 20a and 20b have been defined so as to be located right under, and self-aligned with, the gate electrodes 18a and 18b, respectively. To control the threshold voltage of the TFT 10 at a desired value, ions of a p-type dopant (e.g., boron (B) ions) have been implanted into these channel regions 20a and 20b. As shown in FIG. 2, the channel length L may be determined by the shape of each of the gate electrodes 18a and 18b, while the channel width W may be determined by the shape of the semiconductor layer 14.

At both ends of the semiconductor layer 14, first and second n-type heavily doped regions 28a and 28b have been defined so as to sandwich the channel regions 20a and 20b between them. The first and second heavily doped regions 28a and 28b serve as the source/drain regions of the TFT 10, respectively.

Two types of n-type lightly doped regions 24a and 26a with mutually different carrier concentrations have been defined between the first n-type heavily doped region (i.e., source region) 28a and the first channel region 20a closer to the first heavily doped region 28a, thereby forming an LDD structure. In the following description, these lightly doped regions 24a and 26a will be referred to as third and first lightly doped regions, respectively, for convenience sake. The third lightly doped region 24a adjacent to the channel region 20a has a carrier concentration lower than that of the first lightly doped region 26a adjacent to the source region 28a.

In the same way, two types of n-type lightly doped regions 24b and 26b with mutually different carrier concentrations have been defined between the second n-type heavily doped region (i.e., drain region) 28b and the second channel region 20b closer to the second heavily doped region 28b, thereby forming an LDD structure. In the following description, these lightly doped regions 24b and 26b will be referred to as fourth and second lightly doped regions, respectively, for convenience sake. The fourth lightly doped region 24b adjacent to the channel region 20b has a carrier concentration lower than that of the second lightly doped region 26b adjacent to the drain region 28b.

Furthermore, an n-type intermediate region 22 has been defined between the channel regions 20a and 20b.

The carrier concentrations of the respective regions formed in the semiconductor layer 14 are determined by the concentration(s) of n- and/or p-type dopant(s) introduced into those regions. The carrier concentration of each of these regions is represented as the absolute value of a difference ($N_D$–$N_A$) between the concentrations $N_D$ and $N_A$ of the n- and p-type dopants introduced thereto. The carrier concentrations of the respective regions are represented by the concentration profile illustrated in FIG. 5D. That is to say, the carrier concentrations of these regions are preferably defined so as to satisfy the following relationships:

1) the source and drain regions 28a and 28b have the same carrier concentration;
2) the first and second lightly doped regions 26a and 26b also have the same carrier concentration;
3) the third and fourth lightly doped regions 24a and 24b and the intermediate region 22 also have the same carrier concentration;
4) the carrier concentration of the source and drain regions 28a and 28b is higher than that of the first and second lightly doped regions 26a and 26b; and
5) the carrier concentration of the first and second lightly doped regions 26a and 26b is higher than that of the third and fourth lightly doped regions 24a and 24b or that of the intermediate region 22.

In this manner, the TFT 10 of this illustrative embodiment has the lightly doped regions 24b and 26b with mutually different carrier concentrations between the drain region 28b and the channel region 20b, thereby realizing a gentler carrier concentration profile. As a result, the intensity of the electric field at the end of the drain is weakened and the amount of leakage current flowing through the TFT 10 is reduced.

In addition, in this preferred embodiment, the fourth lightly doped region 24b is provided adjacently to the channel region 20b. Accordingly, even if the second lightly doped region 26b adjacent to the drain region 28b has a relatively high carrier concentration, the amount of leakage current is minimized. That is to say, in a structure like this, the carrier concentration of the second lightly doped region 26b may be higher than that of the conventional single LDD region.

By providing the lightly doped regions 24b and 26b and by controlling the carrier concentrations of these regions appropriately, it is easier to reduce the amount of leakage current and increase the amount of ON-state current at the same time as compared to the conventional TFT having the single LDD structure. That is to say, the amount of leakage current of the TFT 10 is minimized appropriately and yet the amount of ON-state current thereof is increased substantially.

Next, the lengths of the respective regions included in the semiconductor layer 14 will be described with reference to FIG. 3. As used herein, the "length" of each of those regions means the length thereof as measured in the direction in which the carriers move from the drain region toward the source region or vice versa (i.e., in the channel length direction). FIG. 3 illustrates not only the channel length L but also the respective lengths L1, L2, L3, and L4 of the first, second, third and fourth lightly doped regions 26a, 26b, 24a and 24b and the length Li of the intermediate region 22.

In an active-matrix-addressed liquid crystal display device, liquid crystal capacitor and storage capacitor that are connected to the drain of a TFT are charged and discharged. Accordingly, a current can flow bidirectionally between the drain and source of the TFT. In this case, the TFT preferably has symmetrical electrical characteristics. For that purpose, the length L1 of the first lightly doped region 26a is preferably equal to the length L2 of the second lightly doped region 26b. Also, the length L3 of the third lightly doped region 24a is preferably equal to the length L4 of the fourth lightly doped region 24b.

As described above, in the TFT of this preferred embodiment, the carrier concentration and length of the first lightly doped region are preferably equal to those of the second lightly doped region. That is to say, symmetrical carrier concentration profile (see FIG. 5D) and symmetrical source/drain structure are preferably established in the horizontal direction for the first and second lightly doped regions. Also, the carrier concentration and length of the third lightly doped region are preferably equal to those of the fourth lightly doped region. That is to say, symmetrical carrier concentration profile and symmetrical source/drain structure are preferably established in the horizontal direction for the third and fourth lightly doped regions.

Furthermore, to increase the amount of the ON-state current, the length Li of the intermediate region is preferably relatively small and smaller than the combined length of any pair of LDD regions. That is to say, L1+L3>Li and L2+L4>Li are preferably satisfied.

Hereinafter, it will be described with reference to FIGS. 4A through 4I how a TFT substrate, including the TFT 10, for an active-matrix-addressed liquid crystal display device may be fabricated in this preferred embodiment of the present invention.

Figure 4A:
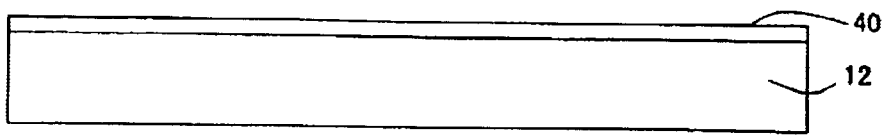
FIGS. 4A through 4I are cross-sectional views illustrating respective process steps for fabricating the TFT of the first embodiment.

First, as shown in FIG. 4A, an amorphous silicon (a-Si) thin film is deposited to a thickness of about 45 nm over the entire surface of an insulating substrate 12 of quartz, for example, by a low-pressure CVD (LPCVD) process. A source gas for use to deposit the a-Si thin film may be $Si_2H_6$ gas, for example. Alternatively, the a-Si thin film may also be deposited by a plasma CVD process at a temperature of about 150° C. to about 250° C.

Then, the a-Si thin film is annealed for about 24 hours within a nitrogen ambient at a temperature of about 600° C., thereby forming a polysilicon (poly-Si) thin film 40 that has an increased crystal grain size.

Alternatively, the poly-Si thin film 40 may also be deposited over the substrate 12 by an LPCVD process. In that case, the poly-Si thin film 40 may be once amorphized by implanting Si ions thereto and then annealed at about 600° C. in a furnace so as to have its crystal grain size increased. Optionally, the poly-Si thin film 40 formed by any of these techniques may be further subjected to laser annealing so as to have its crystallinity improved.

Figure 4B:
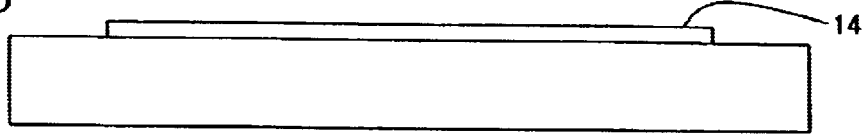

Next, as shown in FIG. 4B, the poly-Si thin film 40 is patterned in such a manner as to leave selected parts thereof corresponding to active regions for respective pixels. In this manner, a semiconductor layer 14 for TFTs is formed. It should be noted that the semiconductor layer 14 does not have to be made of polysilicon.

Figure 4C:
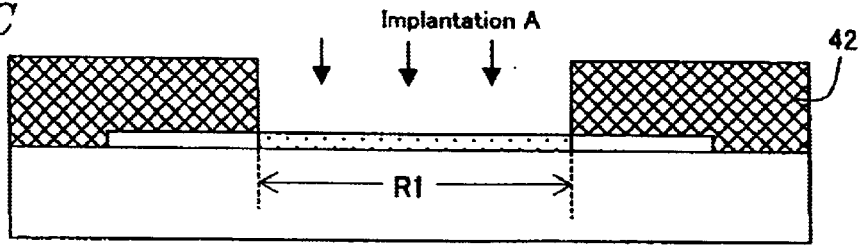

Then, as shown in FIG. 4C, a photoresist pattern 42 is defined on the semiconductor layer 14 so as to selectively cover the horizontal ends of the semiconductor layer 14. Using this resist pattern 42 as a mask, $B^+$ ions are implanted at a dose of about $1 \times 10^{11}$ cm$^{-2}$ to about $5 \times 10^{12}$ cm$^{-2}$ into a predetermined region R1 (which ion implantation process step will be herein identified by "A"). In this manner, in this preferred embodiment, the p-type dopant is introduced into only the predetermined region R1 that has been selected from the semiconductor layer 14 so as to include the channel region of the TFT. Optionally, $BF_2^+$ ions may be implanted instead of the $B^+$ ions.

Figure 4D:
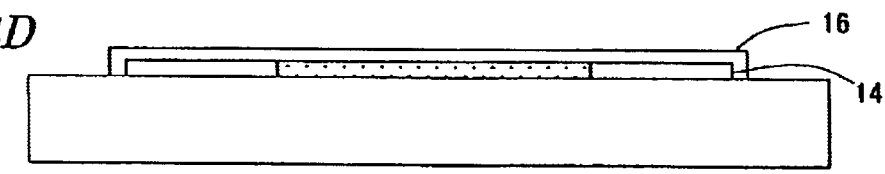

Subsequently, as shown in FIG. 4D, after the photoresist pattern 42 has been removed, a high temperature oxide (HTO) film is deposited to a thickness of about 80 nm over the entire surface of the semiconductor layer 14, thereby forming a gate insulating film 16. Alternatively, the gate insulating film 16 may also be formed by oxidizing the surface of the semiconductor layer 14.

Figure 4E:
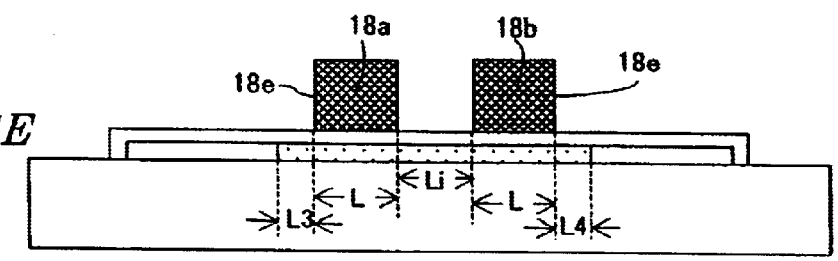

Thereafter, as shown in FIG. 4E, a pair of gate electrodes 18a and 18b is formed over the region R1, into which the $B^+$ ions have been implanted in the process step shown in FIG. 4C, so as to be horizontally spaced apart from each other. Each of the gate electrodes 18a and 18b is formed so as to cover its associated portion of the boron (or any other p-type dopant) doped region R1. Also, each of the gate electrodes 18a and 18b is formed in such a manner that the outer edge 18e of the gate electrode 18a or 18b is spaced apart from, and located inside, the boundary of the p-type doped region R1 by a prescribed distance in a predetermined direction (i.e., the channel length direction). The gate electrodes 18a and 18b extend substantially in the direction coming out of the paper of FIG. 4E and preferably cross the semiconductor layer 14.

These gate electrodes 18a and 18b may be formed in the following manner. First, a poly-Si thin film may be deposited to a thickness of about 400 nm over the gate insulating film 16 by an LPCVD process. Next, the poly-Si thin film may be doped with phosphorus from $POCl_3$ gas, thereby forming a low-resistivity poly-Si thin film as a conductor film. Then, the conductor film may be patterned into the desired shape of the gate electrodes 18a and 18b. It should be noted that in the process step of patterning the conductor film, the gate bus lines 4 and storage capacitor lines 9 shown in FIG. 1 may also be made of the conductor film along with the gate electrodes 18a and 18b.

As will be described later, in those portions of the p-type doped region R1 that are covered with the pair of gate electrodes 18a and 18b, channel regions for the TFT will be defined. The channel length L of these channel regions may be determined by the shape of the gate electrodes 18a and 18b. The channel length L may be about 1.5 μm, for example, while the channel width W (see FIG. 2) may be about 1 μm, for example.

The distance between the gate electrodes 18a and 18b substantially defines the length of the intermediate region, which is the region located between the channel regions in the semiconductor layer 14. The length Li of the intermediate region may be about 1 μm, for example. Also, the distance L3 or L4 between the boundary of the p-type doped region R1 in the semiconductor layer 14 and the outer edge 18e of the gate electrode 18a or 18b corresponds to the length of the third or fourth lightly doped region 24a or 24b as will be described later. These lengths L3 and L4 are preferably equal to each other and may be about 0.75 μm, for example.

Figure 4F:
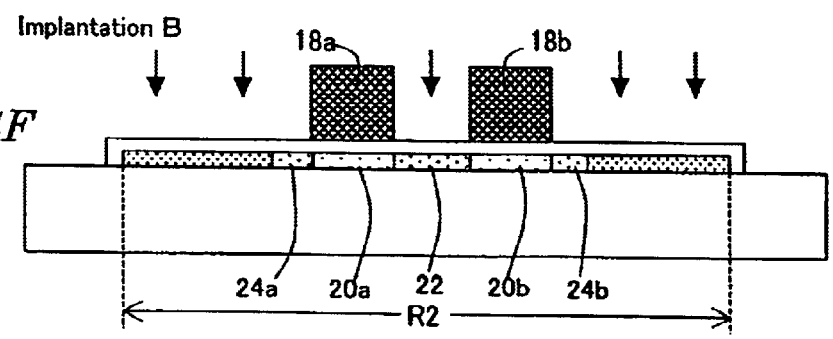

Next, as shown in FIG. 4F, $P^+$ ions are implanted at a dose of about $5 \times 10^{12}$ cm$^{-2}$ to about $5 \times 10^{13}$ cm$^{-2}$ into selected parts of the semiconductor layer 14 using the gate electrodes 18a and 18b as a mask. This ion implantation process step will be herein identified by "B". Alternatively, $As^+$ ions may be implanted instead of the $P^+$ ions. In this manner, n-type doped regions are defined in those parts of the semiconductor layer 14, except the regions under the gate electrodes 18a and 18b, and self-aligned with the gate electrodes 18a and 18b.

Thus, after the gate electrodes 18a and 18b have been formed, a second region R2 of the semiconductor layer 14, including the p-type doped region R1 and regions surrounding the p-type doped region R1, is subjected to the n-type dopant ion implantation. In this preferred embodiment, the entire semiconductor layer 14, except the regions under the gate electrodes 18a and 18b, is doped with the n-type dopant. The implant dose of this n-type dopant is substantially greater than that of the p-type dopant. Accordingly, n-type doped regions, of which the majority carriers are electrons, are formed in the entire semiconductor layer 14 other than those parts covered with the gate electrodes 18a and 18b (i.e., the channel regions 20a and 20b). In the regions that have been implanted with both of the p- and n-type dopant ions, three n-type doped regions with a relatively low carrier concentration are formed. Two of these three n-type lightly doped regions, which are located outside of the channel regions 20a and 20b, will be the third and fourth lightly doped regions 24a and 24b, respectively. The other n-type lightly doped region formed between the channel regions 20a and 20b will be the intermediate region 22.

Figure 4G:
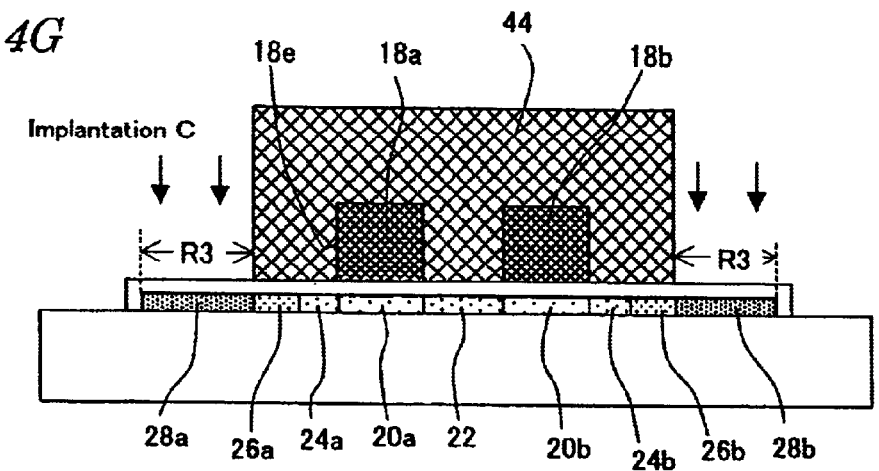

Subsequently, as shown in FIG. 4G, a resist pattern 44 is defined over the substrate so as to cover the gate electrodes 18a and 18b, the intermediate region 22, the third and fourth lightly doped regions 24a and 24b and regions surrounding the third and fourth lightly doped regions 24a and 24b and not to cover both ends of the semiconductor layer 14. The distance between the outer end of the resist pattern 44 and the edge 18e of the gate electrode 18a or 18b may be about 1.5 μm, for example. Thereafter, using this resist pattern 44 as a mask, $P^+$ ions are implanted at a dose of about $5 \times 10^{14}$ cm$^{-2}$ to about $5 \times 10^{15}$ cm$^{-2}$ into non-covered parts of the semiconductor layer 14, thereby defining heavily doped regions 28a and 28b. This ion implantation process step will be herein identified by "C". The implant dose of this ion implantation process step C is substantially greater than that of the ion implantation process step B. Alternatively, $As^+$ ions may be implanted instead of the $P^+$ ions.

In this manner, according to this preferred embodiment, the region R3, which is located outside of, and spaced apart from, the third and fourth lightly doped regions 24a and 24b (i.e., the regions that have been doped with both of the p- and n-type dopants, or the regions where the regions R1 and R2 overlap with each other), is selectively doped with the n-type dopant at a relatively high implant dose. The heavily doped regions 28a and 28b formed in this manner serve as source/drain regions for the TFT.

Also, first and second lightly doped regions 26a and 26b, of which the carrier concentration is determined by the dopant introduced in the ion implantation process step B, are formed between the heavily doped region 28a and the lightly doped region 24a and between the heavily doped region 28b and the lightly doped region 24b, respectively.

In this manner, a multi-gate type TFT 10, having an LDD structure made up of two pairs of lightly doped regions with mutually different carrier concentrations between the source and channel regions and between the drain and channel regions, is completed.

Figure 4H:
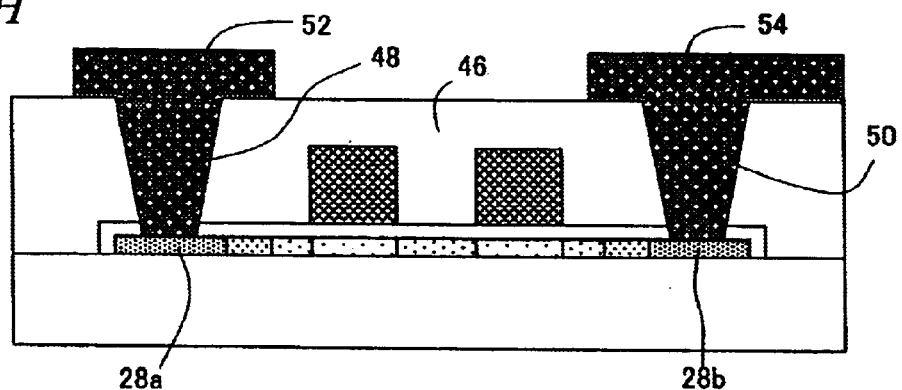

Thereafter, the resist pattern 44 that has been used in the ion implantation process step C is removed and then an interlevel dielectric film 46 of BPSG, for example, is deposited to a thickness of about 600 nm over the substrate by an atmospheric CVD process as shown in FIG. 4H. Then, the semiconductor layer 14 is annealed for about thirty minutes within a nitrogen ambient at a temperature of about 950° C., thereby activating the dopants introduced into the semiconductor layer 14. Next, first and second contact holes 48 and 50 are opened over the source/drain regions 28a and 28b of the semiconductor layer 14, respectively. Thereafter, a conductor film of AlSi, for example, is deposited to a thickness of about 600 nm over the substrate and then patterned into a predetermined shape. In this manner, a source electrode (or source bus line) 52 and drain electrode 54 are formed so as to make electrical contact with the source/drain regions 28a and 28b by way of the contact holes 48 and 50, respectively.

Figure 4I:
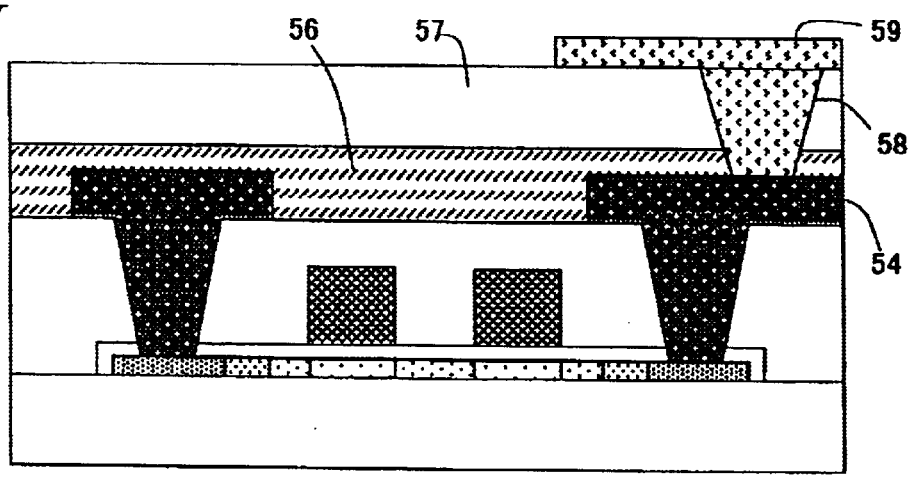

Thereafter, as shown in FIG. 4I, a p-SiNO film 56 is deposited to a thickness of about 200 nm over the entire surface of the substrate by a plasma CVD process, for example, and then a p-SiO film 57 is deposited thereon to a thickness of 700 nm, for example. Subsequently, the substrate is annealed to diffuse hydrogen from the p-SiNO film 56 into the poly-Si thin film and thereby hydrogenate the poly-Si film. Next, after a third contact hole 58 has been formed over the drain electrode 54, a transparent conductor film of indium tin oxide (ITO), for example, is deposited to a thickness of about 150 nm over the substrate and then patterned into a desired shape, thereby forming a pixel electrode 59.

In the fabrication process described above, the respective process steps, including film-deposition, patterning and ion implantation, may be carried out by known methods.

In this manner, the TFT 10 can be formed by a relatively simple fabrication process including the ion implantation process step A (carried out to control the threshold voltage before the gate electrodes are formed), the ion implantation process step B (carried out at a relatively low dose after the gate electrodes have been formed) and the ion implantation process step C (carried out at a relatively high dose after the gate electrodes have been formed). The following Table 1 summarizes the dopants that are introduced into the respective regions of the semiconductor layer 14 of the TFT 10 through the ion implantation process steps A, B and C:

TABLE 1

| Region | Implantation A $B^+$ or $BF_2^+$ | Implantation B $P^+$ or $As^+$ | Implantation C $P^+$ or $As^+$ |
| --- | --- | --- | --- |
| Channel | YES | NO | NO |
| Intermediate | YES | YES | NO |
| $1^{st}$ and $2^{nd}$ LDD | NO | YES | NO |
| $3^{rd}$ and $4^{th}$ LDD | YES | YES | NO |
| $1^{st}$ and $2^{nd}$ HDD | NO | YES | YES |

As described above, the implant doses A, B and C of the respective ion implantation process steps A, B and C are preferably as follows:

Implant dose A: about $1 \times 10^{11}$ cm$^{-2}$ to about $5 \times 10^{12}$ cm$^{-2}$;

Implant dose B: about $5 \times 10^{12}$ cm$^{-2}$ to about $5 \times 10^{13}$ cm$^{-2}$; and Implant dose C: about $5 \times 10^{14}$ cm$^{-2}$ to about $5 \times 10^{15}$ cm$^{-2}$.

Preferably, implant dose C>implant dose B>implant dose A.

Figure 5A:
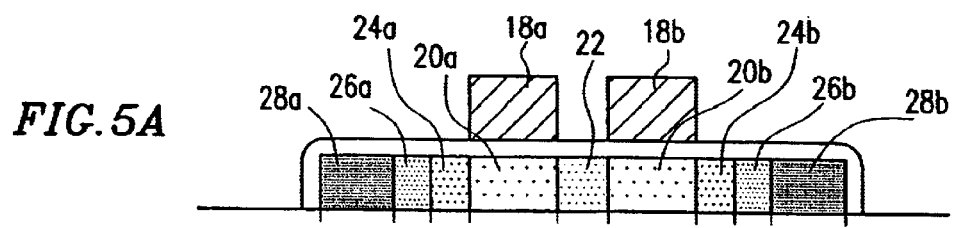
FIG. 5A is a cross-sectional view illustrating the TFT of the first embodiment.
Figure 5B:
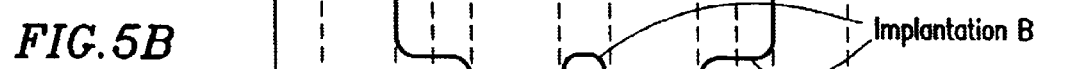
FIG. 5B illustrates a concentration profile of an n-type dopant that has been introduced into the TFT shown in FIG. 5A.
Figure 5C:
FIG. 5C illustrates a concentration profile of a p-type dopant that has been introduced into the TFT shown in FIG. 5A.
Figure 5D:
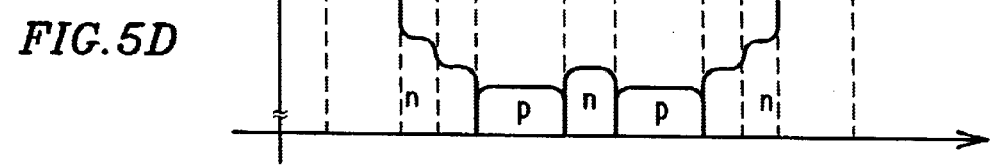
FIG. 5D illustrates an overall carrier concentration profile of the TFT shown in FIG. 5A.

FIGS. 5B through 5D illustrate the concentration profiles of the dopants introduced into the respective regions. Specifically, FIG. 5A illustrates a cross section of the TFT. FIG. 5B illustrates the concentration $N_D$ profile of the n-type dopant introduced into the respective regions. FIG. 5C illustrates the concentration $N_A$ profile of the p-type dopant introduced into the respective regions. And FIG. 5D illustrates the carrier concentrations of the respective regions, i.e., the absolute values of the differences ($N_D$–$N_A$) between the concentrations of the n- and p-type dopants introduced into the respective regions.

As shown in FIG. 5B, the n-type dopant has been introduced into the respective regions other than the channel regions 20a and 20b. The dopant concentrations $N_D$ of the first through fourth lightly doped regions 26a, 26b, 24a and 24b and intermediate region 22 are substantially equal to each other. The dopant concentrations $N_D$ of the first and second heavily doped regions 28a and 28b are higher than the dopant concentrations $N_D$ of these regions 26a, 26b, 24a, 24b and 22. Also, as shown in FIG. 5C, the p-type dopant has been introduced selectively into the third and fourth lightly doped regions 24a and 24b, channel regions 20a and 20b and intermediate region 22, the dopant concentrations $N_A$ of which are substantially equal to each other. Accordingly, the overall carrier concentration $|N_D-N_A|$ of the semiconductor layer 14 decreases at two steps between the heavily doped region 28a or 28b and the channel region 20a or 20b.

In the preferred embodiment described above, the present invention is supposed to be applied to an n-channel TFT. However, the present invention is naturally implementable as a p-channel TFT. In making a p-channel TFT, $P^+$ or $As^+$ ions may be implanted in the ion implantation process step A, and $B^+$ or $BF_2^+$ ions may be implanted in the ion implantation process steps B and C.

Figure 13:
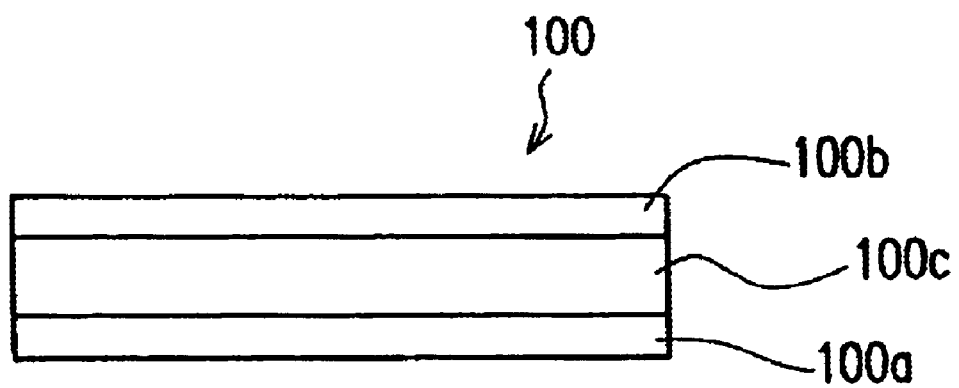
FIG. 13 is a cross-sectional view schematically illustrating an active-matrix-addressed liquid crystal display device according to a preferred embodiment of the present invention.

FIG. 13 illustrates an active-matrix-addressed liquid crystal display device (LCD) 100 that has been formed using a TFT substrate 100a including the TFT 10. As shown in FIG. 13, the LCD 100 includes the TFT substrate 100a, a counter substrate 100b, and a liquid crystal layer 100c sandwiched between the TFT and counter substrates 100a and 100b. Although not shown, the counter substrate 100b includes an insulating substrate and a counter electrode (or common electrode) formed on the insulating substrate.

In a typical TN-mode liquid crystal display device, an alignment film (not shown) is formed on the surface of the TFT substrate 100a that faces the liquid crystal layer 100c and another alignment film (not shown) is formed on the surface of the counter substrate 100b that faces the liquid crystal layer 100c. A polarizer (not shown) is formed on each of the opposite surfaces of the TFT and counter substrates 100a and 100b. However, the alignment films or polarizers may be omitted depending on the display mode adopted. Optionally, to conduct a color display, color filters (not shown) may be provided for the counter substrate 100b, for example.

Embodiment 2

Figure 6:
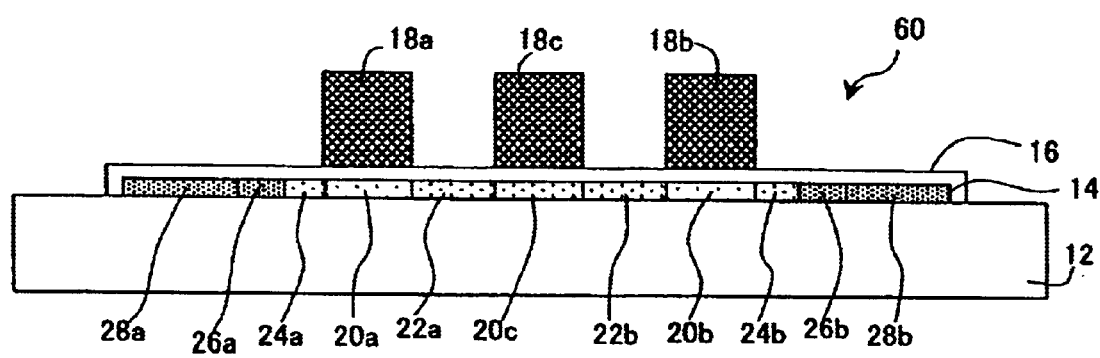
FIG. 6 is a cross-sectional view schematically illustrating a TFT according to a second specific preferred embodiment of the present invention.

Hereinafter, a TFT 60 according to a second specific preferred embodiment of the present invention will be described with reference to FIG. 6. The TFT 60 of the second embodiment is different from the TFT 10 of the first embodiment in that the TFT 60 includes three gate electrodes 18a, 18b and 18c and three channel regions 20a, 20b and 20a associated with the gate electrodes 18a, 18b and 18c, respectively. Accordingly, two intermediate regions 22a and 22b are defined between the channel regions 20a and 20c and between the channel regions 20c and 20b, respectively. In FIG. 6, each component having substantially the same function as the counterpart of the TFT 10 of the first embodiment is identified by the same reference numeral and the description thereof will be omitted herein.

In the TFT 60, a pair of lightly doped regions 24a and 26a with mutually different carrier concentrations is defined between the first heavily doped region (or source region) 28a and the channel region 20a closer to the source region 28a than any other channel region is. In addition, another pair of lightly doped regions 24b and 26b with mutually different carrier concentrations is defined between the second heavily doped region (or drain region) 28b and the channel region 20b closer to the drain region 28b than any other channel region is.

The intermediate regions 22a and 22b are located between the channel region 20c associated with the central gate electrode 18c and the channel region 20a and between the channel regions 20c and 20b, respectively. The intermediate regions 22a and 22b have a dopant concentration profile similar to that of the lightly doped regions 24a and 24b. Neither of these intermediate regions 22a and 22b has to include two types of lightly doped regions with mutually different carrier concentrations.

The TFT 60 may also be fabricated by a process similar to that of the TFT 10 of the first embodiment.

Embodiment 3

Figure 7:
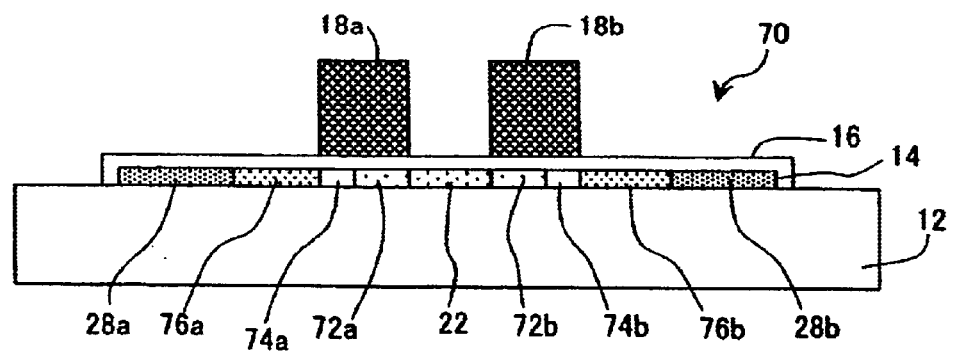
FIG. 7 is a cross-sectional view schematically illustrating a TFT according to a third specific preferred embodiment of the present invention.

Hereinafter, an exemplary configuration for a TFT 70 according to a third specific preferred embodiment of the present invention will be described with reference to FIG. 7. In FIG. 7, each component having substantially the same function as the counterpart of the TFT 10 of the first embodiment is identified by the same reference numeral and the description thereof will be omitted herein. In the following description of the third embodiment, the present invention is supposed to be implemented as an n-channel TFT. However, the present invention is not limited thereto but may naturally be applicable to a p-channel TFT.

In the semiconductor layer 14 of the TFT 70, a first doped channel region 72a and a first intrinsic channel region 74a are formed under the gate electrode 18a. The first intrinsic channel region 74a is a part of the channel region closer to the source region (or first n-type heavily doped region) 28a. In the same way, a second doped channel region 72b and a second intrinsic channel region 74b are formed under the gate electrode 18b. The second intrinsic channel region 74b is a part of the channel region closer to the drain region (or second n-type heavily doped region) 28b. Furthermore, the n-type intermediate region 22 is defined between the first and second doped channel regions 72a and 72b.

Each of these doped channel regions 72a and 72b has been implanted with ions of a p-type dopant such as boron to control the threshold voltage of the TFT 70 at a desired value. On the other hand, neither the intrinsic channel region 74a or 74b has been doped with such a dopant. However, some inevitable impurities may be present in the intrinsic channel regions 74a and 74b in the process step of forming a semiconductor layer or diffusing a dopant.

Also, a first n-type lightly doped region 76a is defined between the source region 28a and the first intrinsic channel region 74a closer to the source region 28a. On the other hand, a second n-type lightly doped region 76b is defined between the drain region 28b and the second intrinsic channel region 74b closer to the drain region 28b. The carrier concentration of the first lightly doped region 76a is set lower than that of the source region 28a, and the carrier concentration of the second lightly doped region 76b is set lower than that of the drain region 28b.

In this manner, the TFT 70 includes the second lightly doped region 76b and the second intrinsic channel region 74b between the drain region 28b and the doped channel region 72b, thereby realizing a less steep carrier concentration profile. As a result, the intensity of the electric field is weakened at the end of the drain and the amount of leakage current is reduced. Also, since the intrinsic channel region 74b is provided adjacently to the second doped channel region 72b to minimize the leakage current, the second lightly doped region 76b adjacent to the drain region 28b may have a relatively high carrier concentration. In this manner, the TFT 70 minimizes the amount of leakage current appropriately and increases the amount of ON-state current substantially just like the TFT 10 of the first embodiment.

In the TFT 70 of this third preferred embodiment, a current may also flow bidirectionally between the source/drain regions. In this case, the TFT 70 preferably has symmetrical electrical characteristics. For that purpose, the length of the first lightly doped region 76a is preferably substantially equal to that of the second lightly doped region 76b. Also, the length of the first intrinsic channel region 74a is preferably substantially equal to that of the second intrinsic channel region 74b.

To increase the ON-state current, the first and second intrinsic channel regions 74a and 74b with a high resistivity are preferably relatively short. For that purpose, the first and second intrinsic channel regions 74a and 74b are preferably shorter than any of the first and second lightly doped regions 76a and 76b and the intermediate region 22.

Hereinafter, it will be described with reference to FIGS. 8A through 8I how a TFT substrate, including the TFT 70, for use in an active-matrix-addressed liquid crystal display device may be fabricated in this preferred embodiment. It should be noted that any process step substantially the same as the counterpart of the process for fabricating the TFT 10 of the first embodiment as shown in FIGS. 4A through 4I will not be described in detail again.

Figure 8A:
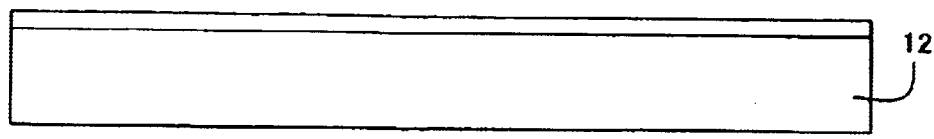
FIGS. 8A through 8I are cross-sectional views illustrating respective process steps for fabricating the TFT of the third embodiment.
Figure 8B:
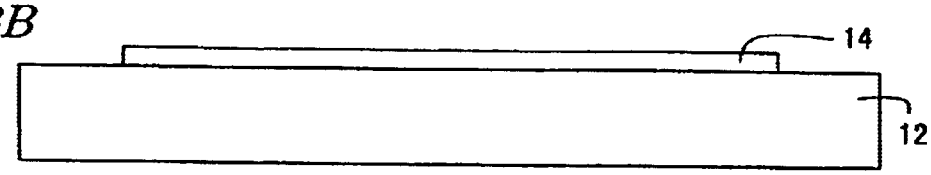

First, as shown in FIGS. 8A and 8B, a semiconductor layer 14 is formed on an insulating substrate 12 by performing process steps similar to those of the first embodiment.

Figure 8C:
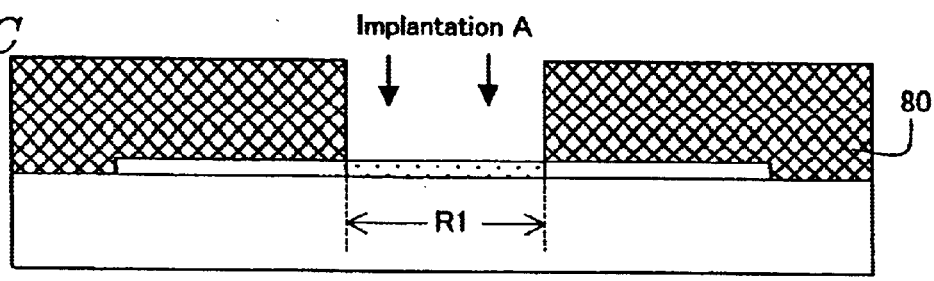

Next, as shown in FIG. 8C, a photoresist pattern 80 is defined on the semiconductor layer 14 so as to selectively cover parts of the semiconductor layer 14 near both ends thereof. Using this resist pattern 80 as a mask, $B^+$ ions are implanted at a dose of about $1 \times 10^{11}$ $cm^{-2}$ to about $5 \times 10^{12}$ $cm^{-2}$ into a predetermined region R1. This ion implantation process step will be herein identified by "A". In this manner, according to this preferred embodiment, ions of a p-type dopant are implanted into only the predetermined region R1 selected from the semiconductor layer 14.

Figure 8D:
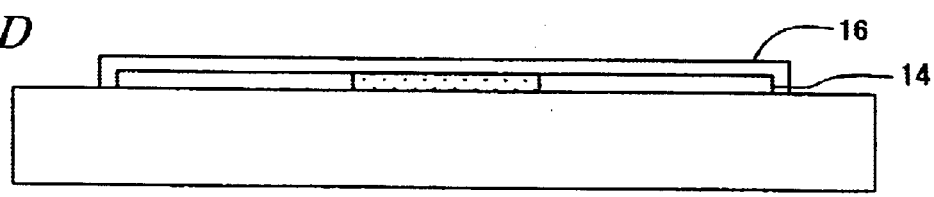

Then, as shown in FIG. 8D, a gate insulating film 16 covering the semiconductor layer 14 is formed by performing a process step similar to that of the first embodiment.

Figure 8E:
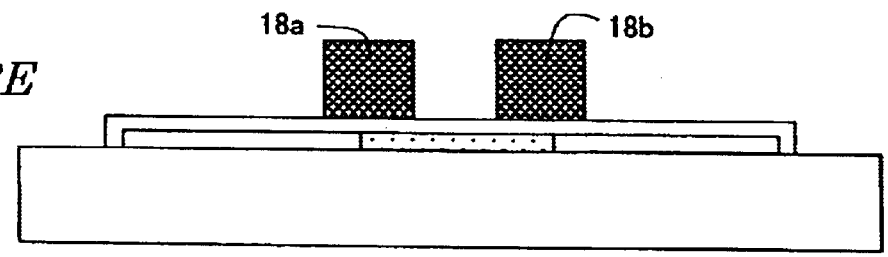

Thereafter, as shown in FIG. 8E, a pair of gate electrodes 18a and 18b is formed over the semiconductor layer 14 so as to be horizontally spaced apart from each other. Each of these gate electrodes 18a and 18b is formed so as to cover the boundary of the p-type doped region R1 (i.e., to cover not only part of the region R1 but also a region outside of the region R1).

Those parts of the region R1, covered with the pair of gate electrodes 18a and 18b, will be doped channel regions for the TFT. On the other hand, those regions covered with the pair of gate electrodes 18a and 18b outside of the region R1 will be intrinsic channel regions for the TFT. The lengths of the doped channel regions and intrinsic channel regions may be determined by the length of the gate electrodes (i.e., the sizes thereof as measured in the channel length direction) and by the positional relationship between the gate electrodes and the region R1. For example, where each of the gate electrodes has a length of about 1.5 $\mu$m, the positional relationship between the gate electrodes and the region R1 is controlled so that each doped channel region has a length of about 0.75 $\mu$m. Also, the length of the intermediate region is determined by the distance between the gate electrodes 18a and 18b. In this preferred embodiment, the intermediate region has a length of about 1 $\mu$m.

Figure 8F:
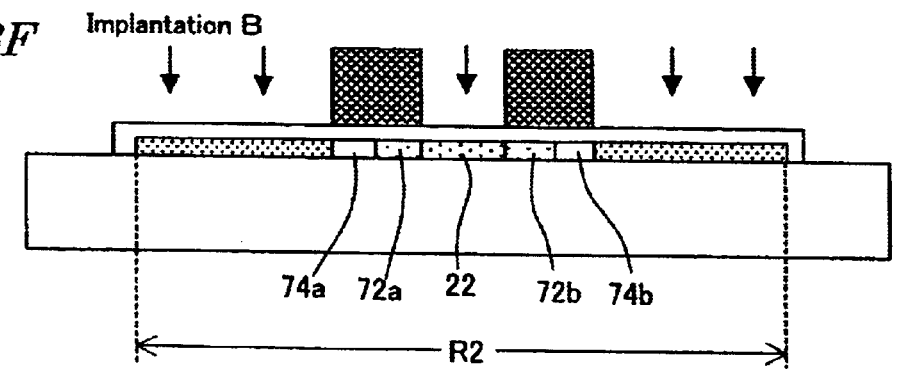

Next, as shown in FIG. 8F, $P^+$ ions are implanted at a dose of about $5 \times 10^{12}$ $cm^{-2}$ to about $5 \times 10^{13}$ $cm^{-2}$ into selected parts of the semiconductor layer 14 using the gate electrodes 18a and 18b as a mask. This ion implantation process step will be herein identified by "B". In this ion implantation process step B, a second region R2 of the semiconductor layer 14, including the p-type doped region R1 and regions surrounding the p-type doped region R1, is subjected to the P⁺ ion implantation. In this preferred embodiment, the entire semiconductor layer 14, except the regions under the gate electrodes 18a and 18b, is implanted with the P⁺ ions. Alternatively, As⁺ ions may be implanted instead of the P⁺ ions.

In this manner, an n-type intermediate region 22 is formed between the p-type-doped channel regions 72a and 72b so as to be self-aligned with the gate electrodes 18a and 18b. Also, n-type lightly doped regions are formed outside of the intrinsic channel regions 74a and 74b so as to be self-aligned with the gate electrodes 18a and 18b, too.

Figure 8G:
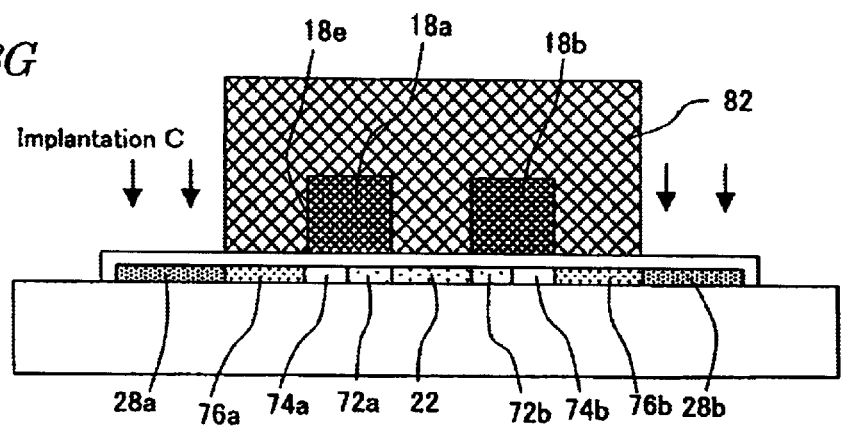

Subsequently, as shown in FIG. 8G, a resist pattern 82 is defined over the substrate so as to cover the gate electrodes 18a and 18b, the intermediate region 22, and the n-type lightly doped regions 76a and 76b located outside of the intrinsic channel regions 74a and 74b. The distance between the right or left end of the resist pattern 82 and the edge 18e of the gate electrode 18a or 18b may be about 1.5 μm, for example. Thereafter, using this resist pattern 82 as a mask, P⁺ ions are implanted at a dose of about $5 \times 10^{14}$ cm$^{-2}$ to about $5 \times 10^{15}$ cm$^{-2}$ into non-covered parts of the semiconductor layer 14, thereby defining first and second heavily doped regions (i.e., source/drain regions) 28a and 28b. This ion implantation process step will be herein identified by "C".

In this manner, a multi-gate type TFT 70, including two pairs of lightly doped and intrinsic channel regions between the source region and the first doped channel region and between the drain region and the second doped channel region, is completed.

It should be noted that the fabrication process of the TFT 70 of this third embodiment may be carried out in the same way as that of the TFT 10 of the first embodiment except that the mask 80 is used instead of the mask 42 (see FIG. 4C) in the ion implantation process step A shown in FIG. 8C.

Figure 8H:
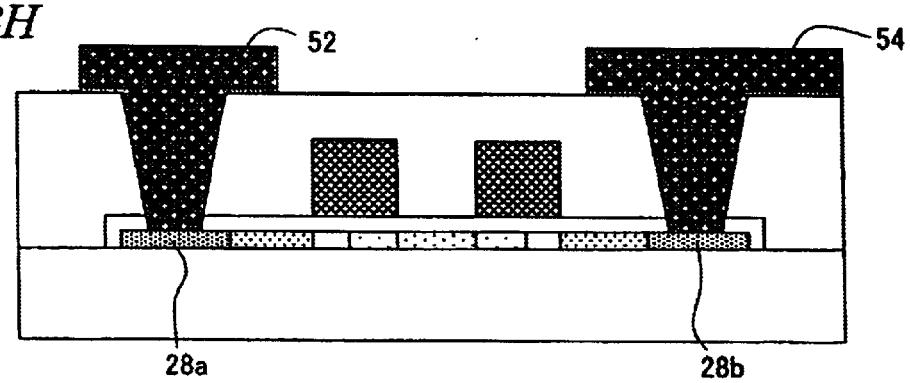
Figure 8I:
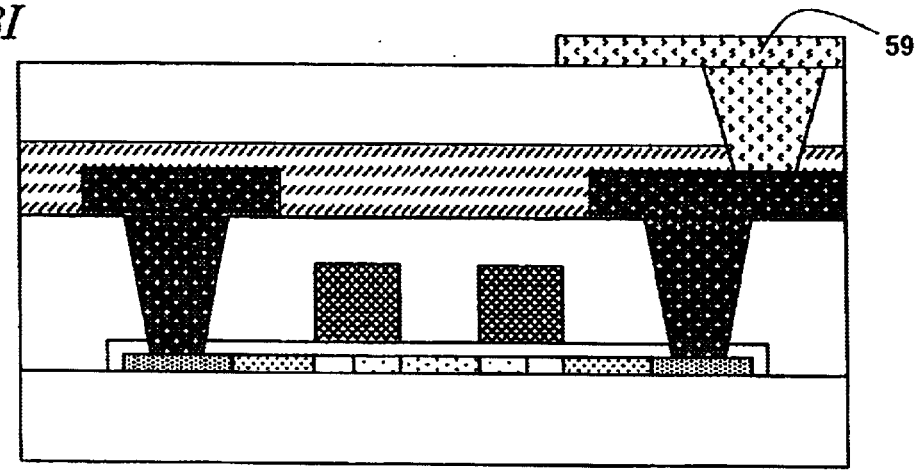

Thereafter, as shown in FIG. 8H, a source electrode (or source bus line) 52 and a drain electrode 54 that make electrical contact with the source/drain regions 28a and 28b, respectively, are formed by performing a process step similar to that of the first embodiment. Subsequently, as shown in FIG. 8I, a pixel electrode 59 made of ITO (indium tin oxide) is formed by performing a process step similar to that of the first embodiment.

In this manner, the TFT 70 may be formed by a relatively simple fabrication process including the ion implantation process steps A, B and C. The following Table 2 summarizes the dopants that are introduced into the respective regions of the semiconductor layer 14 of the TFT 70 through these ion implantation process steps A, B and C:

TABLE 2

| Region | Implantation A<br>B⁺ or BF₂⁺ | Implantation B<br>P⁺ or As⁺ | Implantation C<br>P⁺ or As⁺ |
|---|---|---|---|
| 1ˢᵗ and 2ⁿᵈ doped channel | YES | NO | NO |
| Intermediate | YES | YES | NO |
| 1ˢᵗ and 2ⁿᵈ LDD | NO | YES | NO |
| 1ˢᵗ and 2ⁿᵈ intrinsic channel | NO | NO | NO |
| 1ˢᵗ and 2ⁿᵈ HDD | NO | YES | YES |

As described above, the implant doses A, B and C of the respective ion implantation process steps A, B and C are preferably as follows:

Implant dose A: about $1 \times 10^{11}$ cm$^{-2}$ to about $5 \times 10^{12}$ cm$^{-2}$;
Implant dose B: about $5 \times 10^{12}$ cm$^{-2}$ to about $5 \times 10^{13}$ cm$^{-2}$; and
Implant dose C: about $5 \times 10^{14}$ cm$^{-2}$ to about $5 \times 10^{15}$ cm$^{-2}$.
Preferably, implant dose C>implant dose B>implant dose A.

FIGS. 9B through 9D illustrate the concentration profiles of the dopants introduced into the respective regions. Specifically, FIG. 9A illustrates a cross section of the TFT 70. FIG. 9B illustrates the concentration $N_D$ profile of the n-type dopant introduced into the respective regions. FIG. 9C illustrates the concentration $N_A$ profile of the p-type dopant introduced into the respective regions. And FIG. 9D illustrates the carrier concentrations of the respective regions, i.e., the absolute values of the differences $|N_D - N_A|$ between the concentrations of the n- and p-type dopants introduced into the respective regions.

As shown in FIG. 9B, the n-type dopant has been introduced into the respective regions other than the doped channel regions 72a and 72b and the intrinsic channel regions 74a and 74b. The dopant concentrations $N_D$ of the first and second lightly doped regions 76a and 76b and intermediate region 22 are substantially equal to each other. The dopant concentrations $N_D$ of the first and second heavily doped regions 28a and 28b are higher than the dopant concentrations $N_D$ of these regions 76a, 76b and 22. Also, as shown in FIG. 9C, the p-type dopant has been introduced selectively into the doped channel regions 72a and 72b and intermediate region 22, the dopant concentrations $N_A$ of which are substantially equal to each other. Thus, the carrier concentration $|N_D - N_A|$ of the semiconductor layer 14 decreases at two steps between the heavily doped region 28a or 28b and the doped channel region 72a or 72b.

In the preferred embodiment described above, the present invention is supposed to be applied to an n-channel TFT. However, the present invention is naturally implementable as a p-channel TFT. In making a p-channel TFT, P⁺ or As⁺ ions may be implanted in the ion implantation process step A, and B⁺ or BF₊ ions may be implanted in the ion implantation process steps B and C.

Embodiment 4

Figure 10:
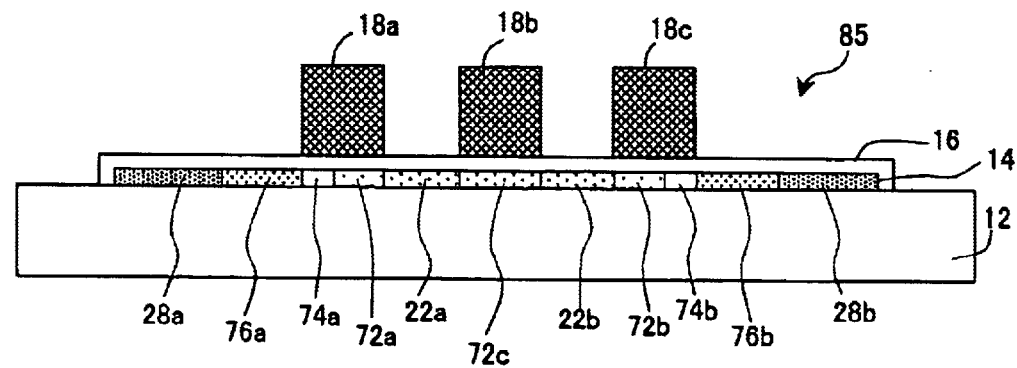
FIG. 10 is a cross-sectional view schematically illustrating a TFT according to a fourth specific preferred embodiment of the present invention.
Figure 11:
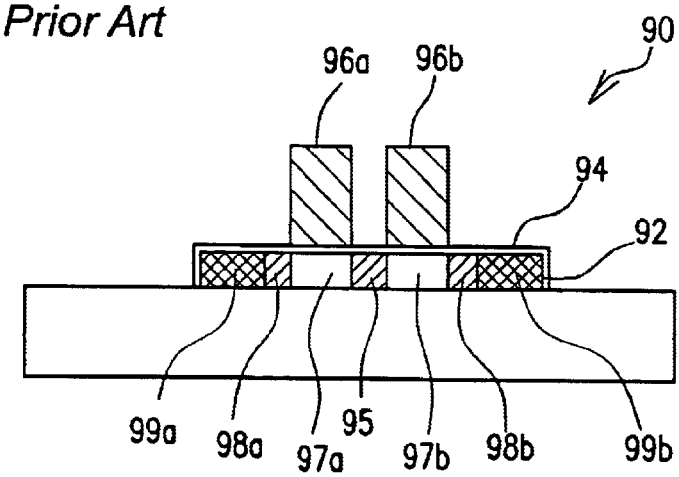
FIG. 11 is a cross-sectional view schematically illustrating a conventional TFT.
Figure 12A:
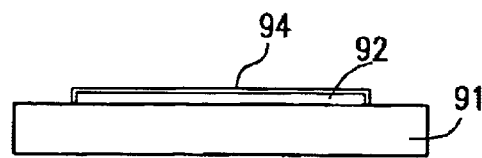
FIGS. 12A through 12G are cross-sectional views illustrating respective process steps for fabricating the TFT shown in FIG. 11.
Figure 12B:
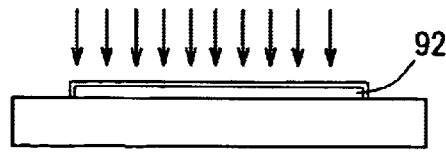
Figure 12C:
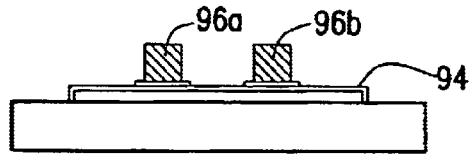
Figure 12D:
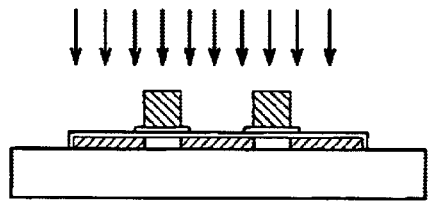
Figure 12E:
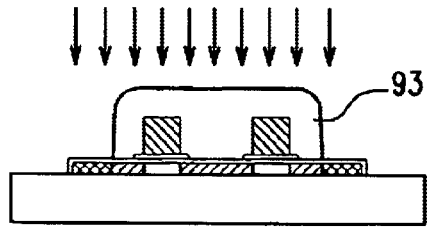
Figure 12F:
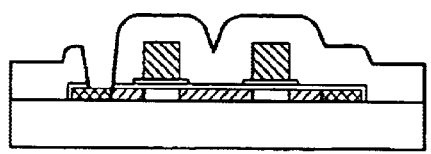
Figure 12G:
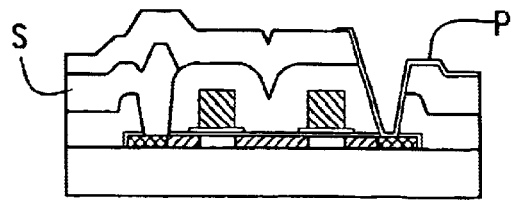

Hereinafter, a TFT 85 according to a fourth specific preferred embodiment of the present invention will be described with reference to FIG. 10. The TFT 85 of the fourth embodiment is different from the TFT 70 of the third embodiment in that the TFT 85 includes three gate electrodes 18a, 18b and 18c. In FIG. 10, each component having substantially the same function as the counterpart of the TFT 70 of the third embodiment is identified by the same reference numeral and the description thereof will be omitted herein.

In the TFT 85, the doped channel region 72a and intrinsic channel region 74a are defined in the channel region, which is closer to the first heavily doped region (i.e., source region) 28a than any other channel region is and which is located under the first gate electrode 18a. Also, the doped channel region 72b and intrinsic channel region 74b are defined in the channel region, which is closer to the second heavily doped region (i.e., drain region) 28b than any other channel region is and which is located under the second gate electrode 18b.

The other channel region 72c associated with the central gate electrode 18c includes no intrinsic channel region. The channel region 72c may have a dopant concentration profile similar to those of the doped channel regions 72a and 72b.

The TFT 85 may also be fabricated by a process similar to that of the TFT 70 of the third embodiment.

According to preferred embodiments of the present invention, at least two types of regions with mutually different carrier concentrations are provided both between the source and channel of the TFT and between the drain and channel thereof In this manner, the leakage current is reduced and the ON-state current is increased. Also, as compared to a TFT having the conventional multi-gate LDD structure, the TFT does not have to have its sizes increased and the redundancy thereof against the leakage failure is not sacrificed.

The present invention is applicable particularly effectively to a small-sized, high-density and high-definition TFT liquid crystal display device including a semiconductor layer of polysilicon.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A thin-film transistor comprising
a semiconductor layer and multiple gate electrodes that have been formed over the semiconductor layer, wherein the semiconductor layer includes:
first and second heavily doped regions, which have a first conductivity type, are spaced apart from each other and serve as source/drain regions;
a plurality of channel regions, which have a second conductivity type, are located between the first and second heavily doped regions so as to face the gate electrodes, and include first and second channel regions, wherein the first channel region is closer to the first heavily doped region than any other one of the channel regions is, while the second channel region is closer to the second heavily doped region than any other one of the channel regions is;
an intermediate region, which has the first conductivity type and is located between two mutually adjacent ones of the channel regions;
a first lightly doped region, which has the first conductivity type and is located between the first channel region and the first heavily doped region;
a second lightly doped region, which has the first conductivity type and is located between the second channel region and the second heavily doped region;
a third lightly doped region, which has the first conductivity type, has a carrier concentration different from that of the first lightly doped region and is located between the first lightly doped region and the first channel region; and
a fourth lightly doped region, which has the first conductivity type, has a carrier concentration different from that of the second lightly doped region and is located between the second lightly doped region and the second channel region.

2. The transistor of claim 1, wherein the first and second heavily doped regions have substantially the same carrier concentration;
the first and second lightly doped regions also have substantially the same carrier concentration;
the third and fourth lightly doped regions and the intermediate region also have substantially the same carrier concentration;
the carrier concentration of the first heavily doped region is substantially higher than that of the first lightly doped region; and
the carrier concentration of the first lightly doped region is substantially higher than that of the third lightly doped region.

3. The transistor of claim 1, wherein the channel regions, the intermediate region and the third and fourth lightly doped regions of the semiconductor layer have been doped with a dopant of the second conductivity type at substantially the same dose.

4. The transistor of claim 3, wherein the third and fourth lightly doped regions have been doped not only with the dopant of the second conductivity type but also the same dopant of the first conductivity type as a dopant that has been introduced into the first and second lightly doped regions.

5. The transistor of claim 4, wherein a difference between the carrier concentration of the third lightly doped region and that of the first lightly doped region is caused by the dopant of the second conductivity type that has been introduced into the third lightly doped region.

6. The transistor of claim 4, wherein a difference between the carrier concentration of the fourth lightly doped region and that of the second lightly doped region is caused by the dopant of the second conductivity type that has been introduced into the fourth lightly doped region.

7. The transistor of claim 1, wherein the first and second lightly doped regions have substantially the same length.

8. The transistor of claim 1, wherein the third and fourth lightly doped regions have substantially the same length.

9. The transistor of claim 1, wherein the intermediate region has a length smaller than a total length of the first and third lightly doped regions.

10. The transistor of claim 1, wherein the intermediate region has a length smaller than a total length of the second and fourth lightly doped regions.

11. The thin-film transistor of claim 1, wherein the carrier concentration of the first lightly doped region is substantially higher than that of the third lightly doped region, the first and third lightly doped regions being located immediately adjacent one another.

12. The thin-film transistor of claim 11, wherein the carrier concentration of the second lightly doped region is substantially higher than that of the forth lightly doped region, the second and forth lightly doped regions being located immediately adjacent one another.

13. A thin-film transistor comprising:
a semiconductor layer and multiple gate electrodes that have been formed over the semiconductor layer,
wherein the semiconductor layer includes:
first and second heavily doped regions, which are spaced apart from each other and serve as source/drain regions;
a plurality of channel regions, which are located between the first and second heavily doped regions so as to face the gate electrodes and which include first and second channel regions, wherein the first channel region is closer to the first heavily doped region than any other one of the channel regions is, while the second channel region is closer to the second heavily doped region than any other one of the channel regions is;
an intermediate region located between two mutually adjacent ones of the channel regions;
a first lightly doped region located between the first channel region and the first heavily doped region; and
a second lightly doped region located between the second channel region and the second heavily doped region; and wherein the first channel region includes a first intrinsic channel region and the second channel region includes a second intrinsic channel region.

14. The transistor of claim 13, wherein the first and second intrinsic channel regions are substantially covered with associated ones of the gate electrodes.

15. The transistor of claim 13, wherein the first channel region includes a doped channel region between the first intrinsic channel region and the intermediate region, while the second channel region includes a doped channel region between the second intrinsic channel region and the intermediate region.

16. The transistor of claim 15, wherein the respective doped channel regions of the first and second channel regions and the intermediate region have been doped with a dopant of a first conductivity type at a predetermined dose.

17. The transistor of claim 13, wherein the first and second lightly doped regions have substantially the same length.

18. The transistor of claim 13, wherein the first and second intrinsic channel regions have substantially the same length.

19. The transistor of claim 13, wherein the first and second intrinsic channel regions are each shorter than any of the intermediate region, the first lightly doped region and the second lightly doped region.

* * * * *